United States Patent [19]
Yoshii et al.

[11] Patent Number: 6,124,601
[45] Date of Patent: *Sep. 26, 2000

[54] POSITION SENSOR HAVING A REFLECTIVE PROJECTING SYSTEM AND DEVICE FABRICATION METHOD USING THE SENSOR

[75] Inventors: Minoru Yoshii, Tokyo; Masanobu Hasegawa; Kyoichi Miyazaki, both of Utsunomiya, all of Japan

[73] Assignee: Canon Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/766,755

[22] Filed: Dec. 13, 1996

[30] Foreign Application Priority Data

Dec. 15, 1995 [JP] Japan .................................... 7-347938

[51] Int. Cl.$^7$ .................................................. G01N 21/86
[52] U.S. Cl. ...................... 250/559.29; 250/548; 356/401
[58] Field of Search ........................... 250/559.29, 559.3, 250/548; 356/399–401, 375; 355/53

[56] References Cited

U.S. PATENT DOCUMENTS

| | | | |
|---|---|---|---|
| 5,191,200 | 3/1993 | van der Werf et al. ............. | 250/201.4 |
| 5,200,800 | 4/1993 | Suda et al. ............................... | 356/401 |
| 5,204,535 | 4/1993 | Mizutani ................................. | 250/548 |
| 5,291,023 | 3/1994 | Hasegawa et al. ..................... | 250/548 |
| 5,313,272 | 5/1994 | Nose et al. .............................. | 356/375 |
| 5,333,050 | 7/1994 | Nose et al. .............................. | 356/356 |
| 5,369,486 | 11/1994 | Matsumoto et al. .................... | 356/349 |
| 5,396,335 | 3/1995 | Hasegawa et al. ...................... | 356/401 |
| 5,432,603 | 7/1995 | Sentoku et al. .......................... | 356/349 |
| 5,461,474 | 10/1995 | Yoshii et al. ............................ | 356/237 |
| 5,486,919 | 1/1996 | Tsuji et al. ............................... | 356/349 |
| 5,495,336 | 2/1996 | Nose et al. ............................... | 356/375 |
| 5,585,918 | 12/1996 | Takeuchi et al. ........................ | 356/237 |
| 5,610,715 | 3/1997 | Yoshii et al. ............................ | 356/356 |
| 5,610,718 | 3/1997 | Sentoku et al. .......................... | 356/363 |

*Primary Examiner*—Que T. Le
*Attorney, Agent, or Firm*—Fitzpatrick, Cella, Harper & Scinto

[57] ABSTRACT

A position detecting apparatus for detecting the position of a substrate in an interval direction in which the substrate is spaced by an interval form a pattern-printing projection optical system for printing pattern on the substrate includes first and second luminous flux projecting and receiving systems and a detector. The first luminous flux projecting system projects a first luminous flux to the substrate form a direction oblique to the interval direction. The first luminous flux receiving system receives a first luminous flux after the first luminous flux is reflected form the substrate. The second luminous flux projecting system projects a second luminous flux to a reflection member secured to the bottom end of the pattern-printing projection optical system. The second luminous flux receiving system receives the second luminous flux after the second luminous flux is reflected by the reflection member. The detection detects the position of the substrate in the interval direction by detecting the position at which the first luminous flux receiving system receives the first luminous flux and by detecting the position at which the second luminous flux receiving system receives the second luminous flux.

16 Claims, 12 Drawing Sheets

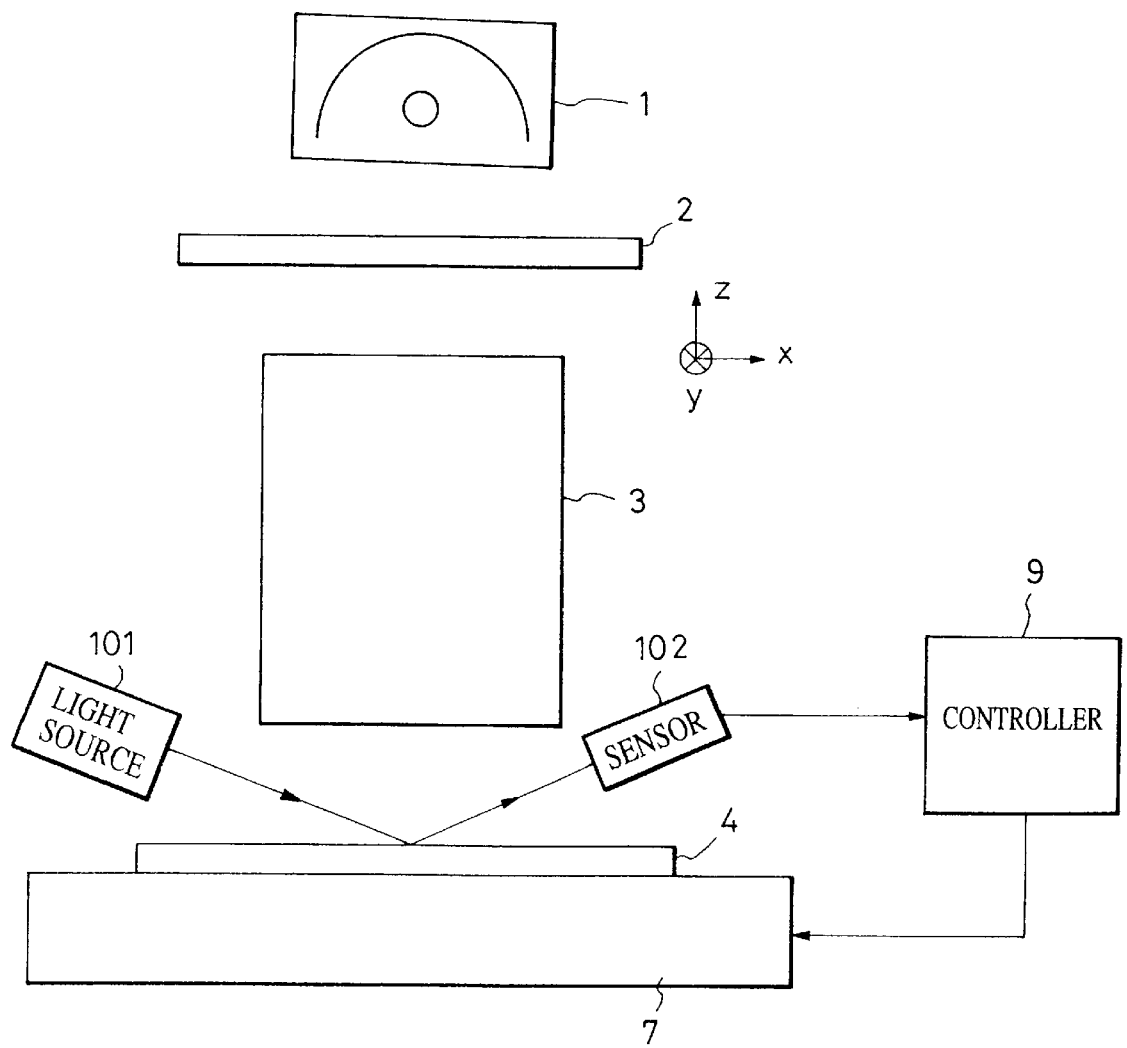
FIG. IA

POSITION SENSOR HAVING A REFLECTIVE PROJECTING SYSTEM AND DEVICE FABRICATION METHOD USING THE SENSOR

BACKGROUND OF THE INVENTION

1. Field of the Invention

The present invention relates to a position sensor and a device fabrication method using the sensor, which is preferably used to perform relative alignment (focusing) between a reticle and a wafer when projecting a pattern on the surface of a first object, such as the reticle, onto the surface of a second object, such as the water, in a projection aligner used in a lithography step among the steps of fabricating, for example, a semiconductor device such as an IC (integrated circuit) or LSI (large scale integrated circuit), imaging device such as a CCD (charge coupled device), display device such as a liquid crystal display panel, or device such as a magnetic head.

2. Description of the Related Art

In recent years, the degree of integration of semiconductor devices, such as an IC and LSI, has accelerated and the fine-patterning technique for a semiconductor wafer has advanced to correspond to the rise of the degree of integration. As the fine-patterning technique, various types of steppers have been proposed in which a circuit pattern image of a mask (reticle) is formed on a photosensitive substrate by a projection optical system (projection lens) to expose the photosensitive substrate by the step-and-repeat method.

In the case of these steppers, the whole surface of a wafer is exposed by repeating the steps of reducing the image of a circuit pattern on a reticle, projecting and transferring the pattern to a predetermined position on the wafer surface through a projection optical system having a predetermined reduction rate, moving a stage with the wafer mounted by a predetermined distance, and performing the transfer again.

In general, to perform the transfer of a fine circuit pattern by a stepper provided with a projection optical system, it is important to properly set exposure conditions such as an exposure value on the surface of a wafer and the focus position of the wafer (position in the optical axis direction of the projection optical system).

Therefore, in the case of a conventional stepper, the optimum exposure condition is determined by printing a pattern on a photosensitive substrate while changing at least either of the exposure conditions of the focus position and the exposure value (shutter time) for every shot in the test printing step (send ahead) before starting the mass production step and thereafter, developing the photosensitive substrate and measuring the line width of a linear pattern by an optical microscope or line-width measuring instrument.

For example, exposure is performing by keeping a focus value constant and changing an exposure value for every certain value in the transverse direction of arrangement in a shot area on a wafer and by keeping the exposure value constant and changing the focus value for every certain value in the longitudinal direction of shot arrangement.

Then, the line width of a resist pattern (L-and-S pattern) of line (L) and space (S) in each shot formed after development is measured by a scanning electron microscope (SEM) and thereby, the optimum focus position and the optimum exposure value of a projection lens are calculated.

FIG. 1A is a schematic view of an essential portion of a projection aligner provided with a conventional position sensor for detecting positional information (information in the optical axis direction) on the surface of a wafer. In FIG. 1A, reference numeral 2 denotes a reticle serving as a circuit original plate, 3 denotes a projection lens for reducing the size of an image of the original plate to ⅕ its original size and projecting it, 4 denotes a wafer coated with resist, and 7 denotes a stage for moving the wafer. By turning on a light source 1 and illuminating the reticle 2 by the luminous flux from the light source 1, a circuit pattern on the reticle 2 is focused on the wafer 4 and printed on the resist. When printing for one shot is completed, the stage 7 is step-driven and the next position is printed. Thus, a circuit pattern is printed on the whole surface of one wafer like a matrix. In the IC mass-production step, wafers are printed at a rate of approximately 60 wafers/hr.

A light source 101 and a luminous-flux position sensor 102 constitute a position detecting system for detecting the height (position in the optical axis direction) of the wafer 4. The sensor 102 outputs a position signal to a controller 9, which drives the stage 7 to make the wafer 4 present at the position at which the circuit pattern is focused on the reticle 4 by the projection lens 3.

FIGS. 1B, 1C and 1D explain the detection theory for detecting the height of the wafer 4. In FIG. 1B, a luminous flux 104 emitted from the light source 101 is reflected from a wafer surface 103 (wafer height 1) to detect the position of the luminous flux (e.g. peak position 102a shown in FIG. 1C) by the luminous-flux position sensor 102.

Then, when the wafer 4 moves to a surface 103a (wafer height 2), the reflected light moves up from position 102a on sensor 102 to a position 102b on sensor 102, which is also shown on the graph in FIG. 1D. In FIGS. 1C and 1D, the h-axis represents the position along the surface of sensor 102 and the i-axis represents the light intensity. FIG. 1D shows the above movement as a change of the luminous energy distribution on the luminous-flux position sensor. Height fluctuation value $\delta$ of the wafer 4 is proportional to fluctuation value $\Delta$ of luminous flux position. Therefore, the height fluctuation value $\delta$ is detected by measuring the fluctuation value $\Delta$. Moreover, the inclination of the wafer 4 is calculated by measuring at least three points in a chip of the wafer 4.

A conventional projection aligner is housed in a clean chamber because the device becomes defective if dust attaches to the surface of the reticle or wafer. The clean chamber is provided with an air conditioning mechanism for keeping a constant temperature because the chamber includes an exothermic source such as a light source. The air conditioning mechanism circulates the constant-temperature air in the chamber in a laminar or turbulent flow and running the air flow from the top to the bottom of the projection aligner or horizontally running it nearby a stage and thereby, prevents the aligner from mechanically deforming and maintains the printing performance.

A mechanism for detecting the height of a wafer and its neighborhood are generally set at the bottom of a projection optical system and the laminar or turbulent flow is also supplied there by the air conditioning mechanism. But, the air flow spatially causes the refractive index of air to fluctuate. Therefore, the luminous flux 104 in FIG. 1B causes fluctuation of the optical path and its incoming position differs on the surface of the sensor 102. Thus, a problem occurs that the detection accuracy of the position on the surface of the wafer 4 decreases.

This inaccuracy in detection has recently become an important problem because the NA (numerical aperture) of an optical system increases as the line width of a circuit has decreased. As a result, the focal depth has decreased. Therefore, it is important to accurately adjust the height of a wafer to the best focus position of a projection optical system.

SUMMARY OF THE INVENTION

It is the first object of the present invention to provide a position sensor capable of accurately detecting the surface position of a wafer or the like even if air fluctuation occurs and a device fabrication method using the sensor.

According to one aspect, the present invention which achieves this objective relates to a position detecting apparatus for detecting the position of a substrate in the interval direction in which the substrate is spaced by an interval from a pattern-printing projection optical system for printing a pattern on the substrate. The apparatus comprises first and second luminous flux projecting and receiving systems and detecting means. The first luminous flux projecting system projects a first luminous flux to the substrate from a direction oblique to the interval direction. The first luminous flux receiving system receives the first luminous flux after the first luminous flux is reflected from the substrate. The second luminous flux projecting system projects a second luminous flux to a reflection member secured to the bottom end of the pattern-printing projection optical system. The second luminous flux receiving system receives the second luminous flux after the second luminous flux is reflected by the reflection member. The detecting means detects the position of the substrate in the interval direction by detecting the position at which the first luminous flux receiving system receives the first luminous flux and by detecting the position at which the second luminous flux receiving system receives the second luminous flux.

According to another aspect, the present invention which achieves this objective relates to a position detecting apparatus for detecting the position of a substrate in the interval direction in which the substrate is spaced by an interval from a pattern-printing projection optical system for printing a pattern on the substrate. The apparatus comprises first and second luminous flux projecting and receiving systems and detecting means. The first luminous flux projecting system projects a first group of luminous fluxes to the substrate from a direction oblique to the interval direction. The first luminous flux receiving system receives a luminous flux of the first group of luminous fluxes reflected form the substrate. The second luminous flux projecting system projects a second group of luminous fluxes to a reflection member secured to the bottom end of the pattern-printing projection optical system. The second luminous flux receiving system receives a luminous flux of the second group of luminous fluxes reflected by the reflection member. The detecting means detects the position of the substrate in the interval direction by detecting the position at which the first luminous flux receiving system receives at least any one of the first group of luminous fluxes and by detecting the position at which the second luminous flux receiving system detects at least any one of the second group of luminous fluxes.

According to still another aspect, the present invention which achieves this objective relates to a device fabrication method. The method comprises arranging, projecting, reflecting, receiving, adjusting, and printing steps. The arranging step arranges a pattern-printing projection optical system at a position to print a device pattern on a substrate at a printing position on the substrate. A first projecting step projects a first luminous flux to the substrate from a direction oblique with respect to an interval direction in which the substrate and the pattern printing projection optical system are spaced apart by an interval. A first reflecting step reflects the first luminous flux from the substrate. A first receiving step receives the first luminous flux reflected from the substrate. A second projecting step projects a second luminous flux to a reflection member secured to the bottom end of the pattern-printing projection optical system. The second reflecting step reflects the second luminous flux from the reflection member. The second receiving step receives the second luminous flux reflected from the reflection member. The adjusting step adjusts the interval between the substrate and the pattern-printing projection optical system by detecting the positions at which the first luminous flux and the second luminous flux are received in the receiving steps. The printing step prints a device pattern on the substrate with the pattern-printing projection optical system. The method also comprises the step of repeating the projecting, receiving, adjusting, and printing steps a plurality of times to form the device on the substrate.

Other objects of the present invention will become apparent from the description of embodiments to be mentioned later, in conjunction with the attached drawings.

BRIEF DESCRIPTION OF THE DRAWINGS

FIG. 1A is a schematic view of an essential portion of a projection aligner having a conventional position sensor.

DESCRIPTION OF THE PREFERRED EMBODIMENTS

Figure 1B:
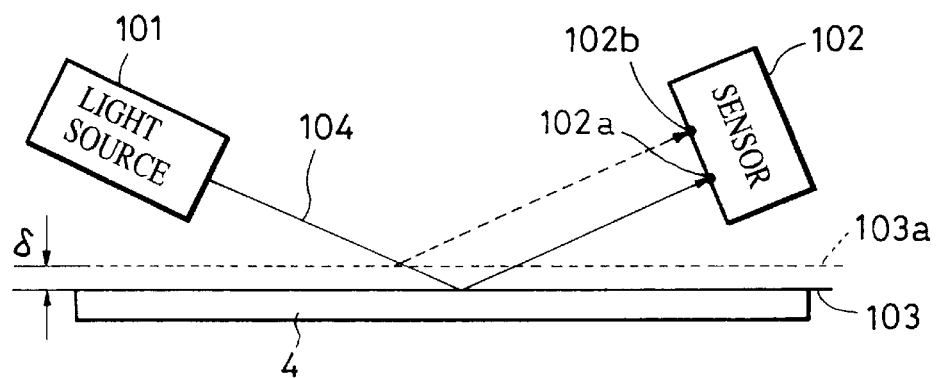
FIG. 1B is an illustration for explaining a position detecting method by a conventional position sensor.
Figure 1C:
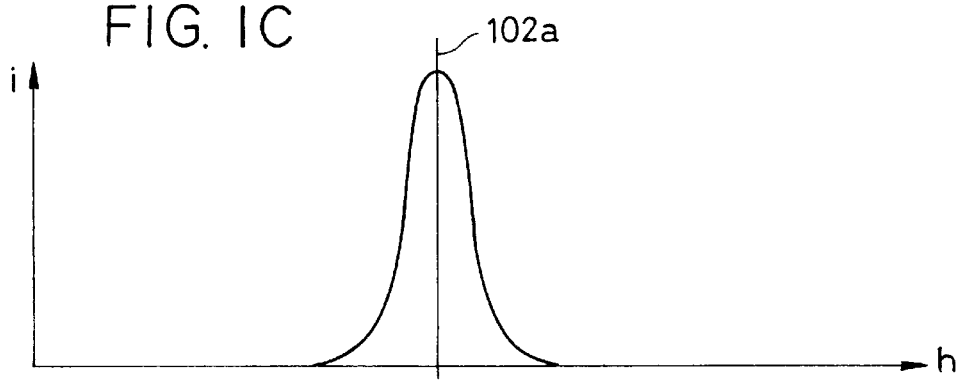
FIGS. 1C and 1D are graphs of the output of sensor 102.
Figure 1D:
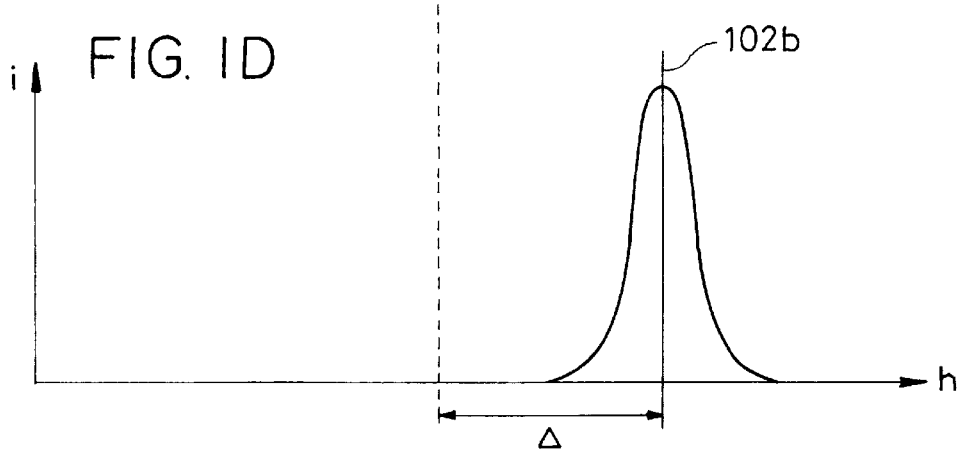
Figure 2A:
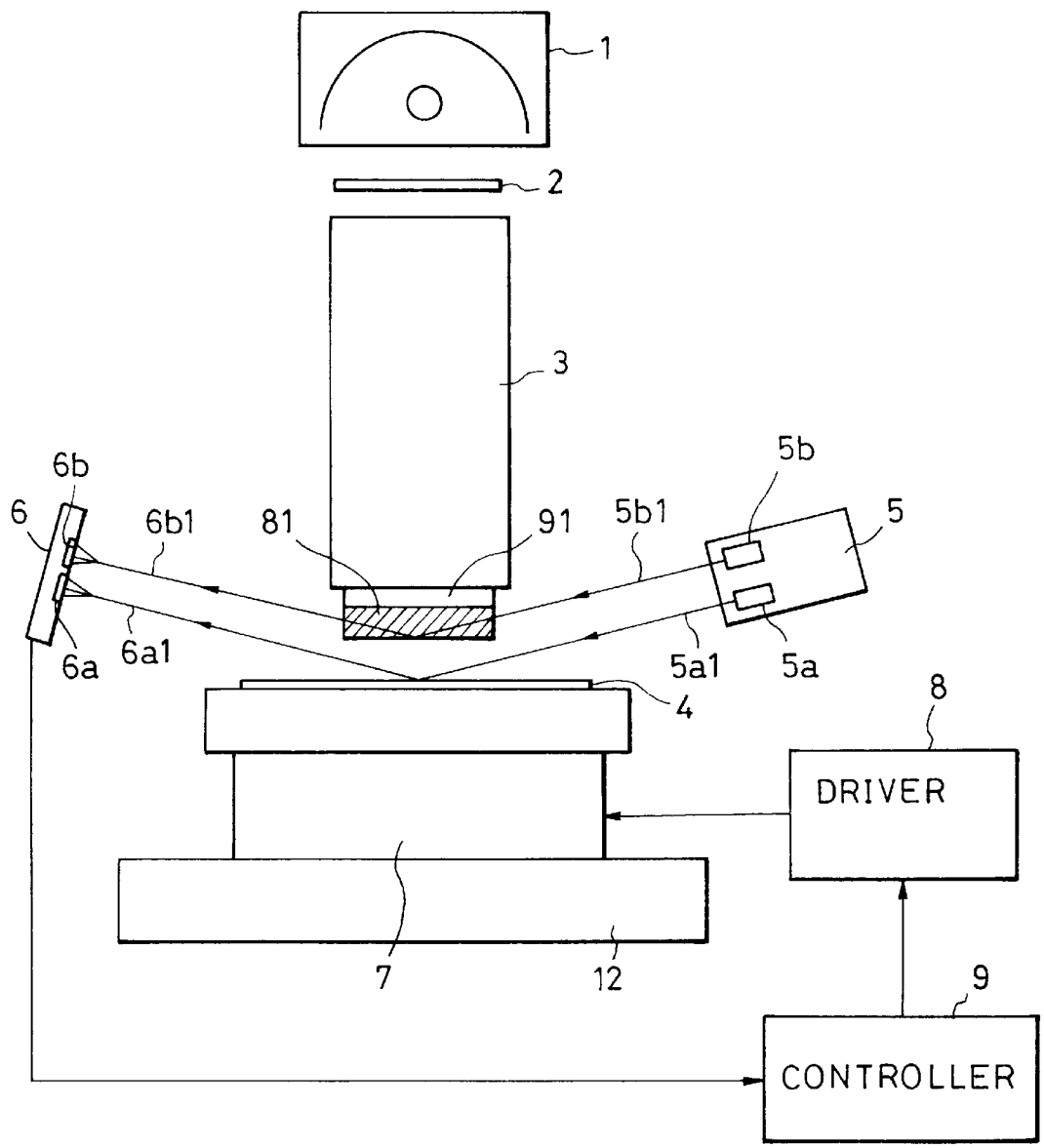
FIG. 2A is a schematic front view of an essential portion of embodiment 1 of the present invention.
Figure 2B:
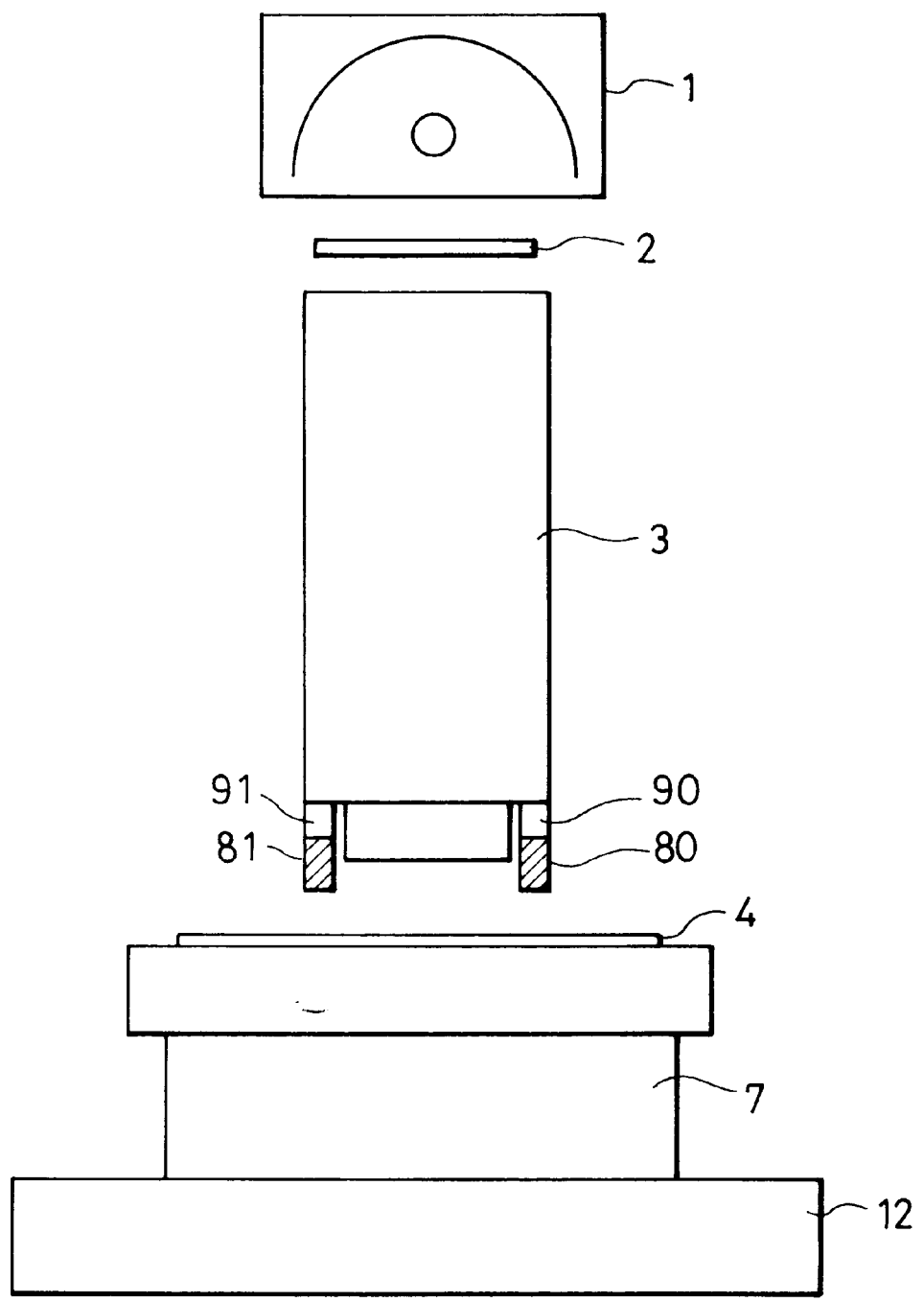
FIG. 2B is a schematic side view of the essential portion in FIG. 2A.
Figure 3:
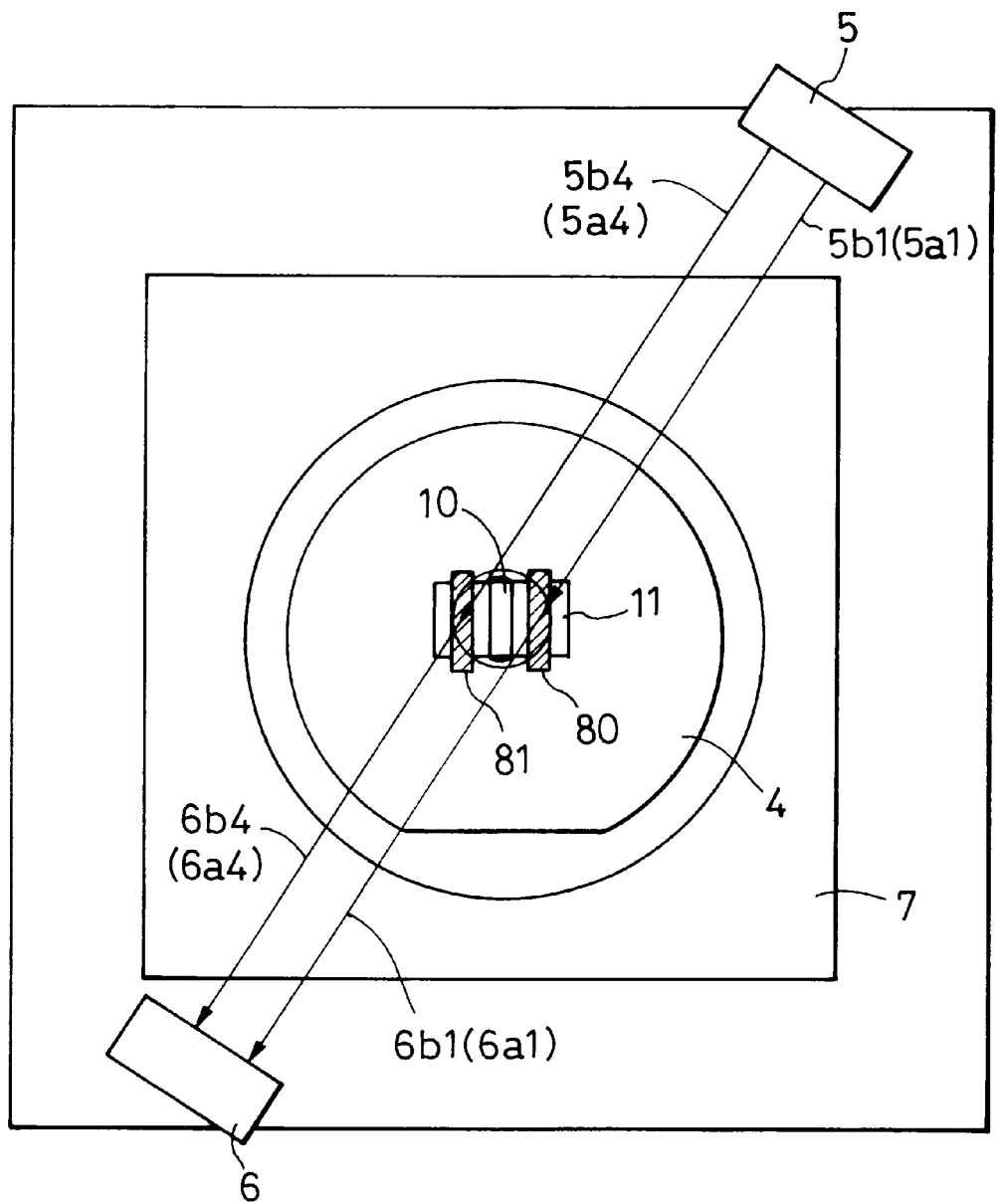
FIG. 3 is an enlarged schematic illustration of a portion in FIG. 1.

FIG. 2A is a schematic view of an essential portion of embodiment 1 of the present invention, FIG. 2B is a schematic side view of the essential portion in FIG. 2A, and FIG. 3 is an enlarged illustration of a portion in FIG. 2A. This embodiment shows the case in which the present invention is applied to a projection aligner using the step-and-scan method for fabricating a device.

In these drawings, reference numeral 1 denotes an illumination system for emitting exposure rays, which emits the i-line of DUV or exposure rays of a KrF or ArF excimer laser. Reference numeral 2 denotes a reticle (first object) on which a circuit pattern is drawn. Reference numeral 3 denotes a projection lens (projection optical system) which reduces the image of the circuit pattern on the reticle 2 and projects it to a wafer (second object) 4 coated with resist.

This embodiment performs projection exposure while synchronizing the reticle 2 with the wafer 4 in accordance with the focusing magnification of the projection optical system 3 and making them scan at a predetermined speed ratio.

Reference numeral 5 denotes light source means which has a light projecting section 5a for projecting a luminous flux 5a1 (though only one luminous flux is shown in FIG. 2A, a plurality of luminous fluxes are actually used, as described later) for detecting the position of the wafer 4 in the optical axis direction of the projection lens 3 and a light source section 5b for projecting a luminous flux 5b1 (though only one flux is shown in FIG. 2A, a plurality of fluxes are actual used, as described later) to detect the fluctuation of air nearby the wafer 4.

In the case of this embodiment, the light projecting section 5a is constituted separately from the light source section 5b. However, it is also within the scope of the present invention to constitute the light sources of the both sections by the same light source so that optical paths are separated from each other.

Reference numeral 6 denotes light receiving means which has a detecting section 6a for detecting a luminous flux 6a1 reflected from the surface of the wafer 4 as a result of luminous flux 5a1 being reflected from wafer 4 and a light receiving section 6b for receiving a luminous flux 6b1 constituting the luminous flux 5b1 having been disturbed by the air to detect the fluctuation of air near the wafer 4.

The detecting section 6a and light receiving section 6b comprises independent photoelectric conversion devices, that is, they comprise, for example, a CCD (charge coupled device) or PSD (position sensing device), respectively, or comprise a common photoelectric conversion device. The light projecting section 5a and the detecting section 6a constitute one element of a position detecting section and the light source section 5b and the light receiving section 6b constitute one element of a fluctuation detecting section.

Reference numeral 7 denotes a stage movable in x, y, or z direction to change the position and tiltable to change the inclination of the wafer 4. Reference numerals 80 and 81 denote auxiliary optical members (reflection members) for reflecting the luminous flux 5b1 nearby the wafer 4. Reference numerals 90 and 91 denote support portions for supporting the auxiliary optical members 80 and 81, respectively. Reference numeral 8 denotes a driving section which drives the stage 7 in x, y, or z directions, and tilts the stage 7. Reference numeral 9 denotes a control section (controller) which outputs a signal for setting the wafer 4 to a predetermined position to the driving section 8, in accordance with a signal output from the light receiving means 6, which drives the stage 7 to the predetermined position. Reference numeral 12 denotes a stage board.

FIG. 2B particularly shows the positional relation between the auxiliary optical members 80 and 81, their support members 90 and 91, and the projection optical system 3. The auxiliary optical members 80 and 81 are secured to a part of the frame of the projecting optical system 3 through the support members 90 and 91, respectively, and the projection optical system 3 is secured to an unillustrated while frame.

Thus, the auxiliary optical members 80 and 81 are integrated with the frame. FIG. 3 shows the positional relation between the light source means 5, light receiving means 6, and auxiliary optical members 80 and 81. In FIG. 3, reference numeral 10 denotes an exposure area to which a pattern on the surface of the reticle 2 is projected by the projection optical system 3. Reference numeral 11 denotes the size of one chip. The exposure area 10 has a slit shape and is used to perform step-and-scan exposure by synchronously scanning the stage 7 and reticle 2. The projection aligner of this embodiment can directly be applied to a normal stepper which does not perform scanning.

Reference numerals 5a1 and 5a4 denote luminous fluxes for detecting the height of the surface of a wafer 5b1 and 5b4 denote luminous fluxes for detecting the fluctuation of air.

As shown in FIG. 3, this embodiment detects positional information for luminous fluxes 6a1 and 6a4 when the luminous flux 5a1 and the luminous flux 5a4 are, respectively, reflected from the surface of the chip 11 and enter the detecting section 6a in the form of the luminous fluxes 6a1 and 6a4. The controller 9 then obtains the height of the wafer 4 in the optical axis direction (Z direction) at two positions using the output of light receiving means 6. Moreover, the air fluctuation nearby each detection position is detected from the positional information of each luminous flux when the luminous 5b1 and the luminous flux 5b4 are reflected on the auxiliary optical members 80 and 81, respectively, and enter the detecting section 6b. The controller 9 then obtains the height of the wafer 4 in the optical axis direction (z direction) at two positions using the output of the light receiving means 6. The detection theory is described later.

In the case of this embodiment, a measuring point to be detected is set at both sides of the exposure area 10. Thus, it is possible to previously read the height of the wafer 4 by using the front measuring point of the exposure area for scanning even if the wafer 4 is scanned in the right or left direction. Moreover, the wafer is controlled so that the height of the wafer is accurately adjusted to the best focus position when the wafer reaches its exposure position.

Figure 4:
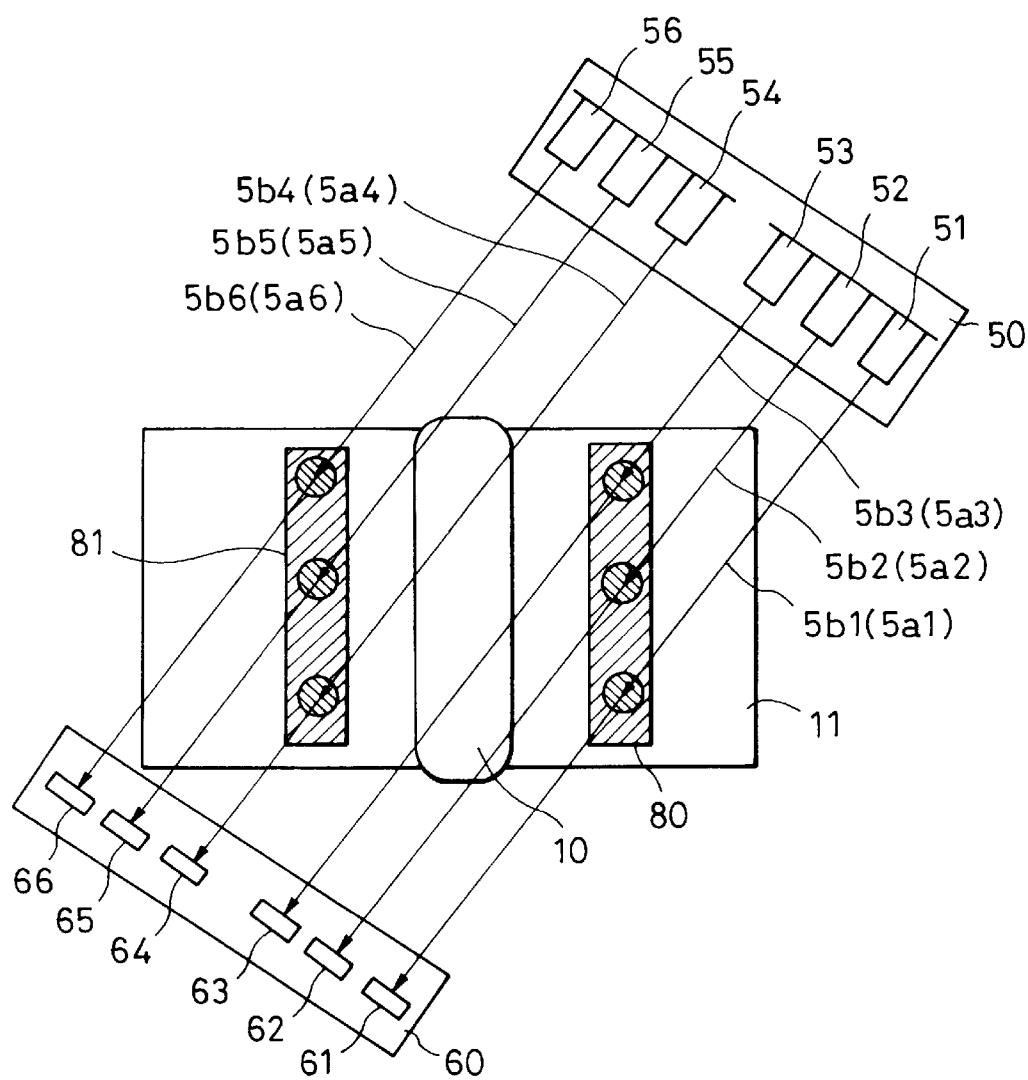
FIG. 4 is an enlarged schematic illustration of a portion of a modification.

FIG. 4 is an illustration for explaining a modification of embodiment 1, which clearly shows the positional relation between luminous fluxes emitted from light source surfaces 51 to 56, the auxiliary optical members 80 and 81, and light receiving surfaces 61 to 66 constituting the light receiving means 6 by further enlarging the neighborhood of the chip 11 in FIG. 3. As shown in FIG. 4, by arranging three measuring points at the left of the exposure area (denotes by three circles at the left of area 10), a vertical tilt of the wafer can be detected when scanning the wafer and the controller 9 outputs a command to the driving sections 8 to control the tilt of the wafer in accordance with the detection result. Therefore, it is possible to perform exposure while correcting a very small tilt of each exposure area during scanning. Thus, an advantage peculiar to a scanning exposure system is demonstrated.

In FIG. 4, the light projecting section for emitting the luminous fluxes 5a1 to 5a6 to detect the height of the wafer 4 and the light source section for emitting the luminous fluxes 5b1 to 5b6 to detect air fluctuation comprise the same light source train 50 and moreover, the detecting section 6a for receiving a luminous flux to detect the height of the wafer 4 and the light receiving section 6b for receiving a luminous flux to detect air fluctuation comprise the same light receiving surface 60. The light source train 50 has six light projecting surfaces 51 to 56 and the light receiving surface 60 has six light-receiving elements 61 to 66. Optical members for separating the luminous fluxes 5a1 to 5a6 and the luminous fluxes 5b1 to 5b6, respectively, from the light source train 50 are not illustrated.

Figure 5:
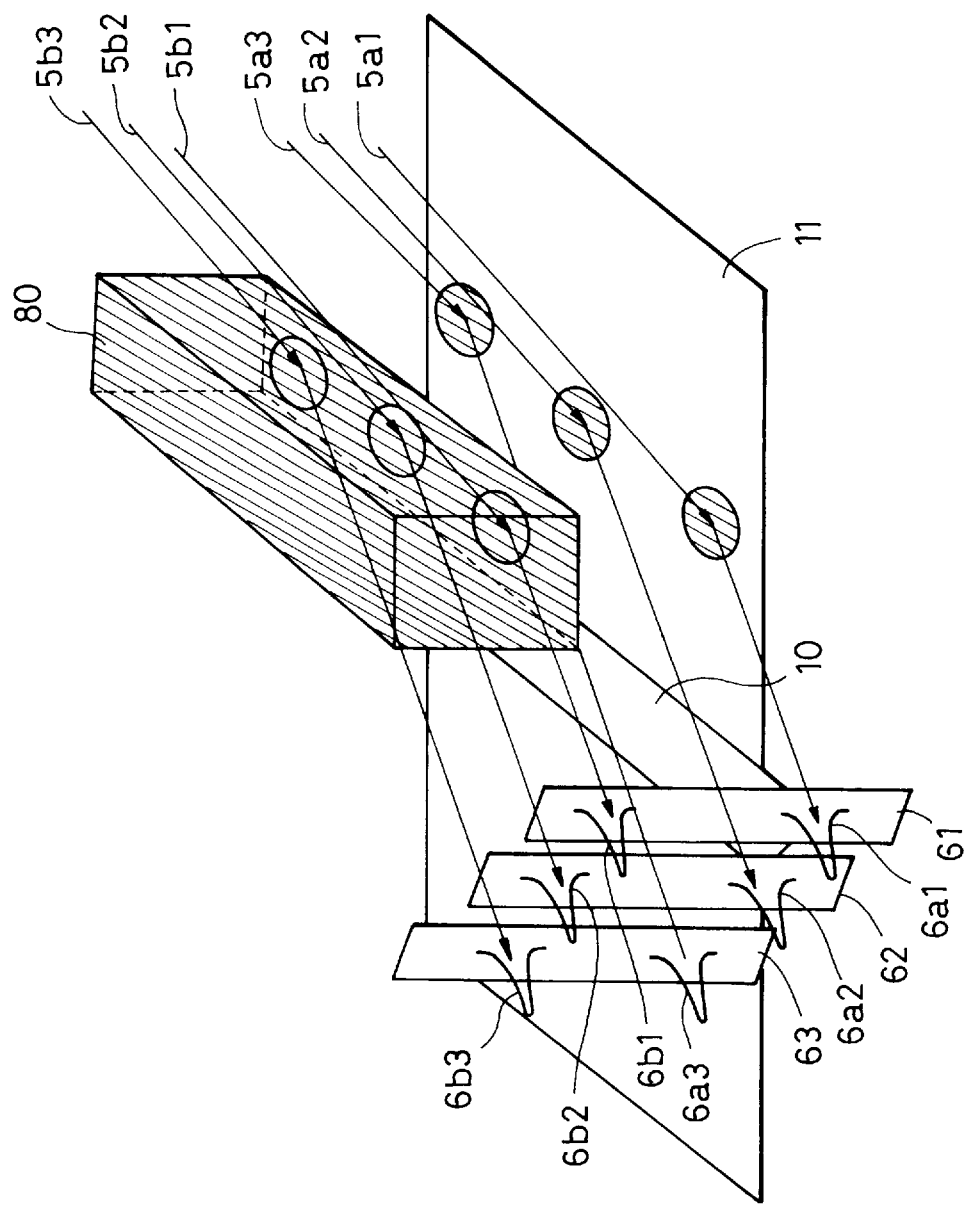
FIG. 5 is an enlarged schematic illustration of a portion of FIG. 4.

FIG. 5 is a perspective view of an essential portion of a part shown in FIG. 4. In FIG. 5, the luminous flux 5a1 (5a2, 5a3) for detecting the height of the wafer 4 enters the light receiving element 61 (62, 63) as the luminous flux 6a1 (6a2, 6a3) after being reflected from the surface of the chip 11. Moreover, the luminous flux 5b1 (5b2, 5b3) for detecting air fluctuation centers the light receiving element 61 (62, 63) as the luminous flux 6b1 (6b2, 6b3) after being regularly reflected by the auxiliary optical member 80. The luminous fluxes 5b1 to 5b3 are reflected by the auxiliary optical member 80 supported by the frame and enter the light receiving elements 61 to 62, respectively, so as to detect only air fluctuation when the luminous fluxes 5b1 to 5b3 pass through the air without being influenced by the height or inclination of the wafer 4.

Figure 6:
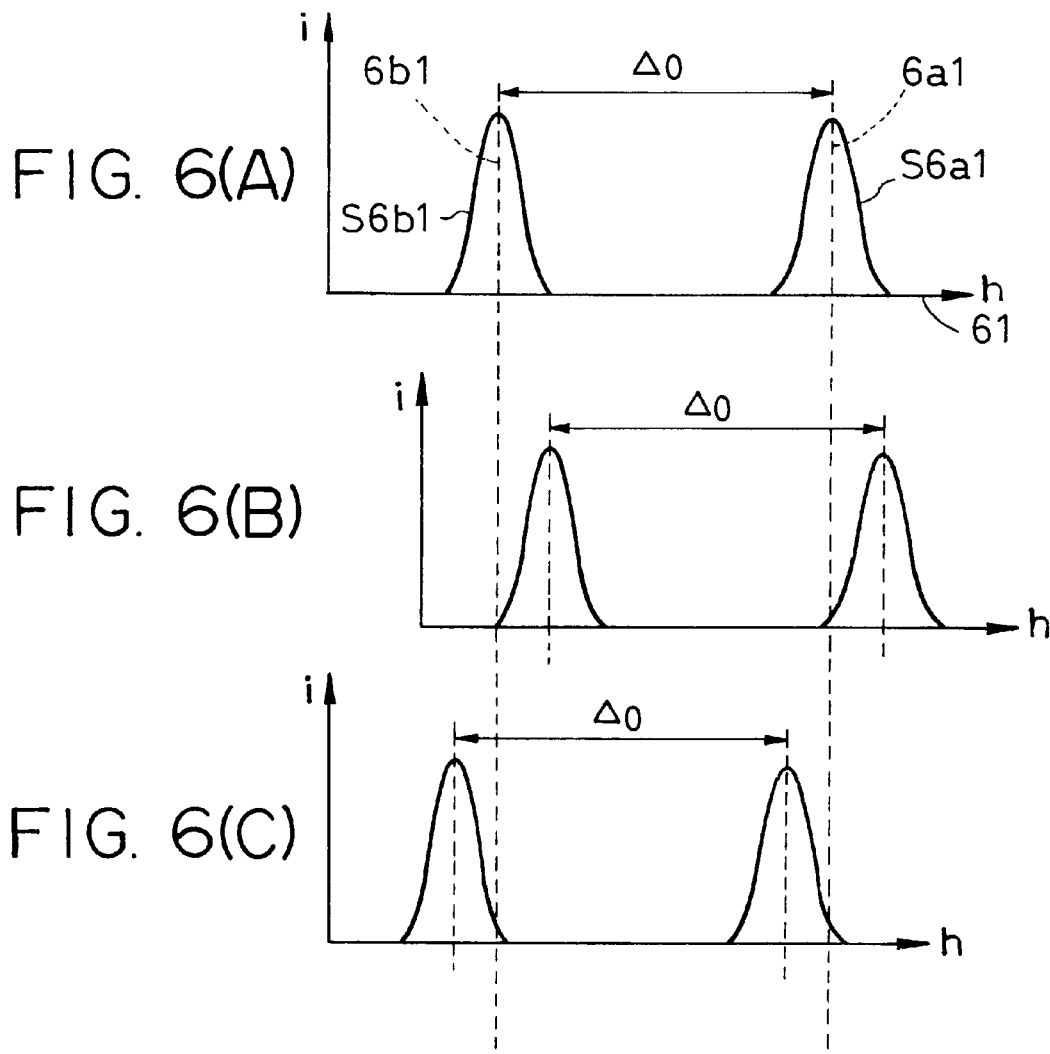
FIGS. 6A to 6C are illustrations of signals output from light receiving means.

A method for detecting the information on the height of the wafer 4 when air fluctuation occurs in this embodiment including the above modification is described below by referring to FIGS. 6A–6C. The method is described below by using the luminous fluxes 6a1 and 6b1 as representative examples. FIGS. 6A–6C are illustrations showing luminous energy distributions S6a1 and S6b1 when the luminous 6a1 and 6b1 enter one light receiving element 61 in FIG. 5 when wafer 4 is at three different conditions. In FIGS. 6A–6C, the h-axis represents the position along the surface of element 61 and the i-axis represents the detected light intensity.

FIGS. 6A to 6C are illustrations for explaining the positions of the luminous fluxes 6a1 and 6b1 entering the light receiving element 61 and signals S6a1 and S6b1 output from the light receiving element 61 when air fluctuation occurs due to the density of air when the height of the wafer 4 is constant. The centers of gravity of the luminous fluxes 6a1 and 6b1 are equally influenced by air fluctuation because the luminous fluxes 5a1 (6a1) and 5b1 (6b1) pass through almost the same space even if the density of the air through which the luminous fluxes pass fluctuates. Therefore, the luminous fluxes can be accurately determined because fluctuate almost equally.

Therefore, because distances $\Delta_n$ between centers of gravity of the output signals S6a1 and S6b1 shown in FIGS. 6A to 6C are equally influenced by air fluctuation, the distance from the auxiliary member 80 to the chip 11 of the wafer 4 can be accurately determined because the influence of air fluctuation is canceled. In the case of this embodiment, the distance $\Delta_e$ between the then centers of gravity is calculated by the controller 9 to obtain the information for the height (optical axis direction) from the auxiliary optical system 80 to the wafer 4.

That is, this embodiment obtains the information for the distance from a predetermined surface of the auxiliary optical member 80 (81) integrated with the frame of the projection optical system 2 to the wafer 4 by removing the influence of air fluctuation in accordance with a signal sent from the light receiving means 6, drives the driving section 8 with the control section 9 in accordance with the distance information, and thereby controls the wafer 4 to be placed at a desired position (optimum focusing plane position of the projection optical system).

Figure 7:
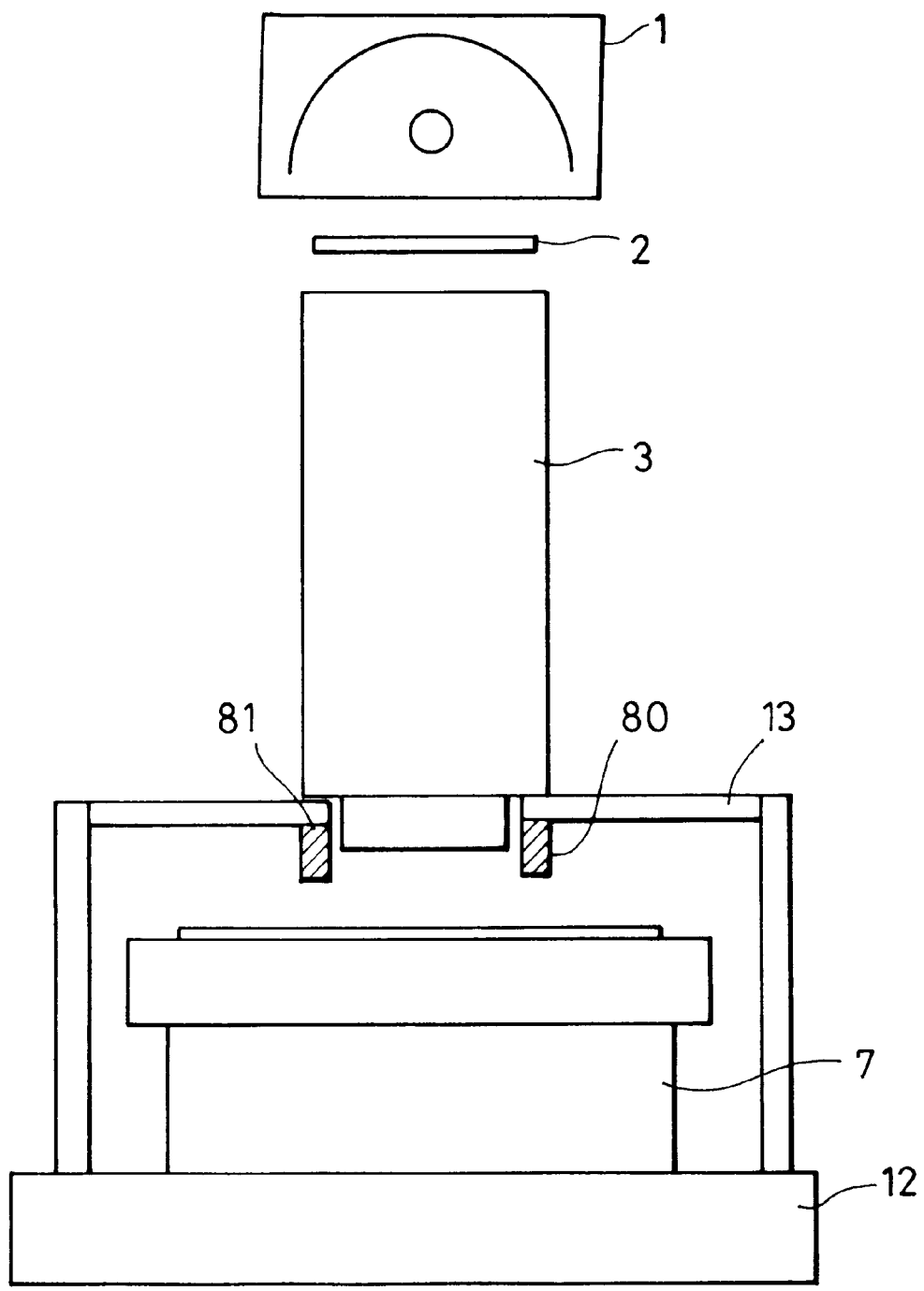
FIG. 7 is a schematic view of an essential portion of embodiment 2 of the present invention.

FIG. 7 is a schematic view of an essential portion of embodiment 2 of the present invention. The same reference numbers that are used in both FIGS. 2A, 2B and 7 denote the same elements. The embodiment 2 is different from the embodiment 1 in that the auxiliary optical members 80 and 81 are provided on a part of a support member 13 supported by the stage board 12. Otherwise it is the same. The embodiment 2 preferably performs correction due to air fluctuation by excluding errors due to thermal deformation of a lens barrel.

Figure 8:
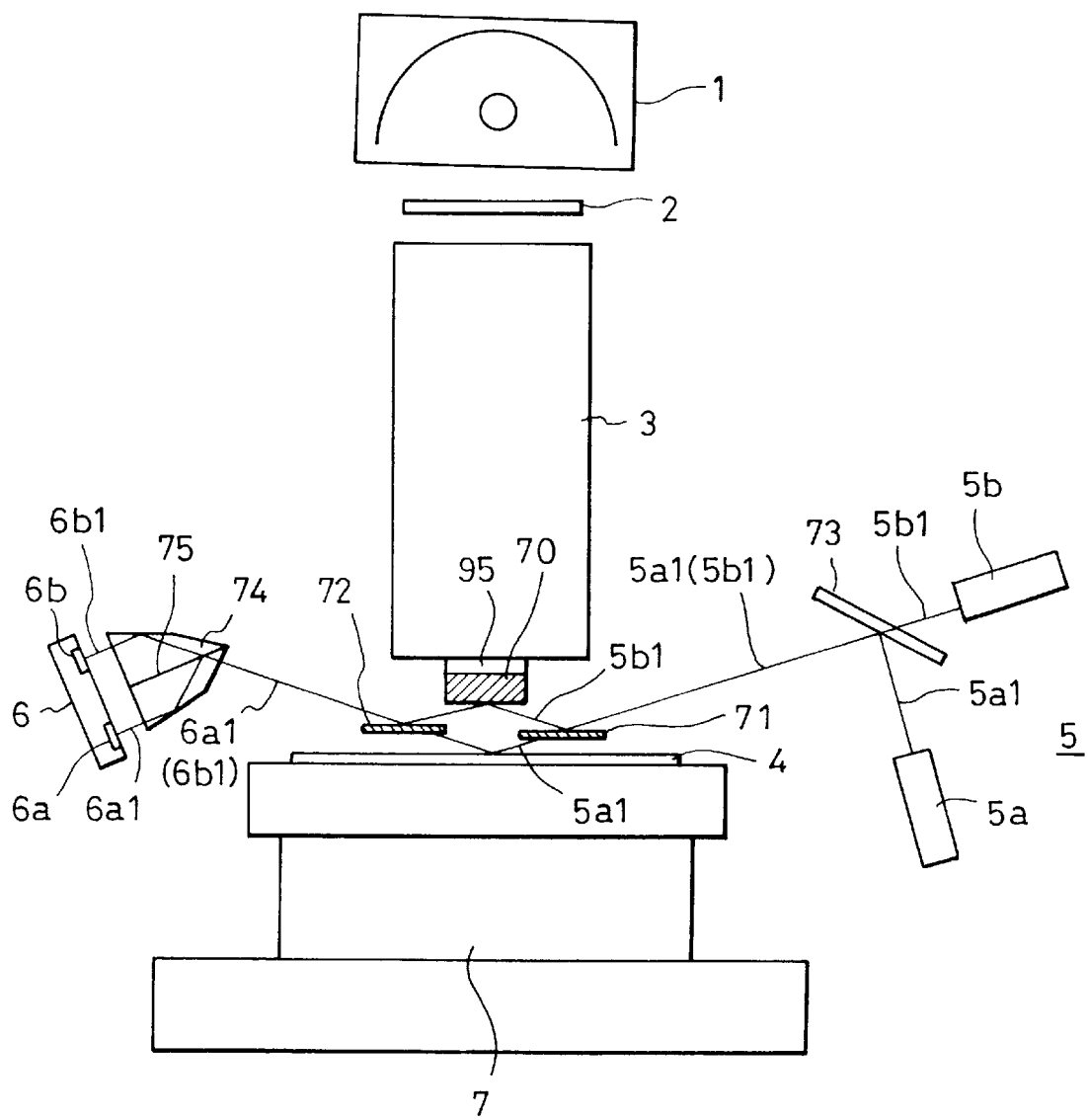
FIG. 8 is a schematic view of an essential portion of embodiment 3 of the present invention.

FIG. 8 is a schematic view of an essential portion of embodiment 3 of the present invention. Reference numerals that are the same in FIGS. 2A, 2B and 8 denote similar elements. This embodiment is different from the embodiment 1 in that the optical path of the luminous flux 5a1, emitted from the projecting section 5a for detecting the position of the surface of the water 4, and the optical path of the luminous flux 5b1, emitted from the light source section 5b for detecting air fluctuation, are the same until they reach the neighborhood of an exposure position on wafer 4 by using dichroic mirrors 71 to 73. The other structures are almost the same.

In the case of this embodiment, the light projecting section 5a and the light source section 5b use light sources for emitting luminous fluxes with wavelengths different from each other. The dichroic mirror 73 forms a coaxial luminous flux by transmitting the luminous flux 5b1 emitted from the light source section 5b and reflecting the luminous flux 5a1 emitted from the light projecting section 5a. Reference numerals 71 and 72 denote dichroic mirrors which transmit the luminous flux 5a1 and reflect the luminous flux 5b1. Reference numeral 70 denotes a mirror and reference numeral 95 denotes a support member for supporting the mirror 70. Reference numeral 74 denotes a Kessler prism and a split plane 75 thereof also comprises a dichroic mirror.

The light source section 5b and the light projecting section 5a are simultaneously turned on, the luminous flux 5a1 as flux 6a1 enters the detecting section 6a by including the information on the height of the wafer 4 and the information on air fluctuation and the luminous flux 5b1 as flux 6b1 enters the light receiving section 6b by including the information only on the air fluctuation near the luminous flux 5a1 by passing through the dichroic mirrors 73, 71, 72, and 75 and the mirror 70 without detecting the height of the wafer 4. This embodiment is the same as the embodiment 1 in that the difference $\Delta_o$ between the positions of centers of gravity of these two luminous fluxes serves as the information in which air fluctuation errors are canceled out and only the height of a wafer is included. Moreover, the detecting section 6a and the light receiving section 6b use the same light receiving element. Though the above embodiments show a method of separating the optical paths of two wavelengths from each other by dichroic mirrors, it is also within the scope of the present invention to use luminous fluxes with one wavelength and thereby obtain two luminous fluxes in accordance with the difference between polarization directions.

Figure 9:
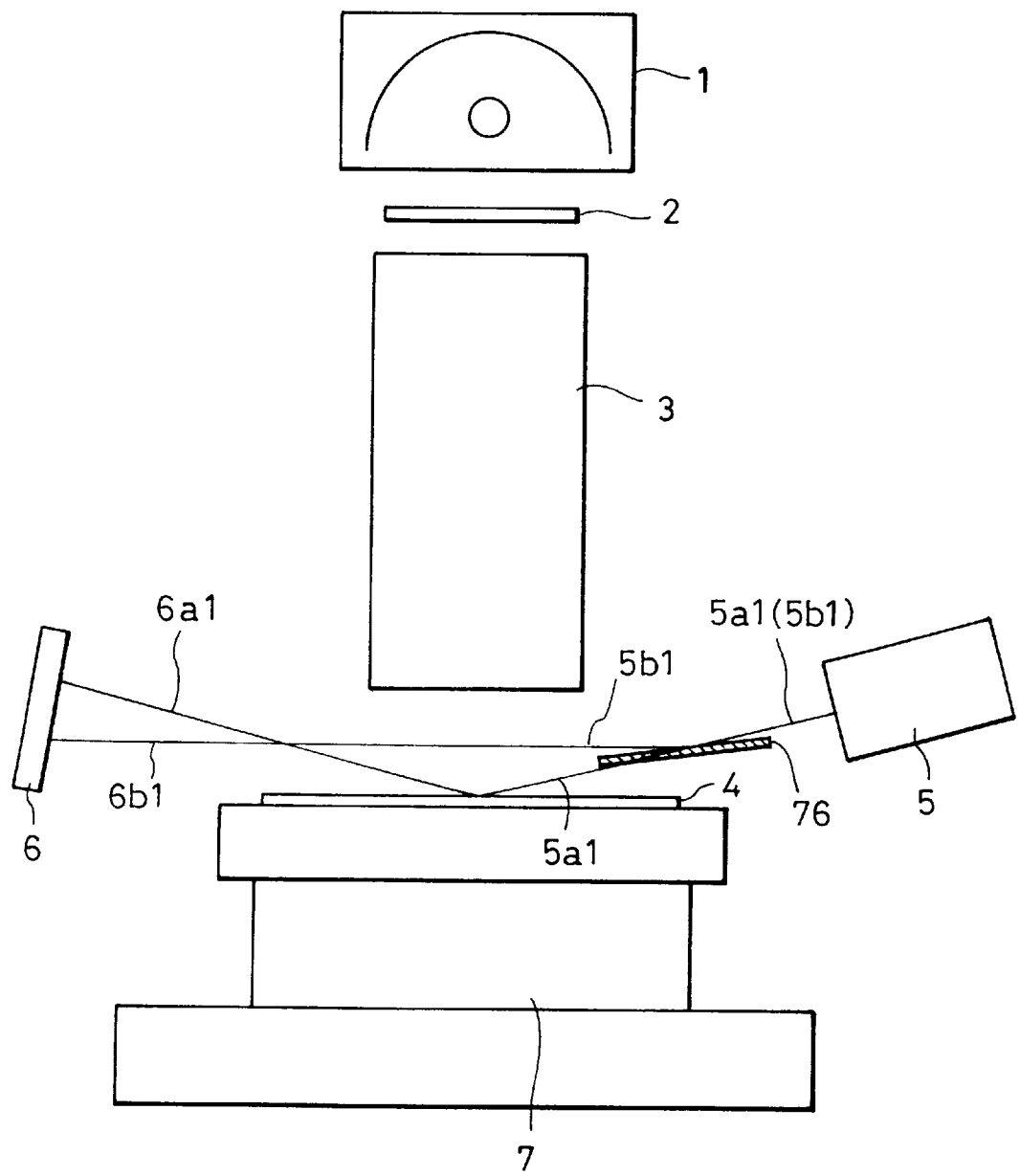
FIG. 9 is a schematic view of an essential portion of embodiment 4 of the present invention.

FIG. 9 is a schematic view of an essential portion of embodiment 4 of the present invention. The same reference numerals used in FIGS. 2A, 2B, and 9 denote the same elements. This embodiment is different from the embodiment 1 in that the fluctuation detecting section detects air fluctuation without using an auxiliary optical member. Otherwise, the two structures are the same. The luminous flux 5a1 for detecting the heights of the surface of the wafer 4 among the luminous fluxes emitted from the light source means 5 passes through a half mirror 76, which is fixed in relation to the projection lens 3, is reflected by the surface of the wafer 4, and enters the light receiving means 6 as the luminous flux 6a1. In this case, it is necessary to constitute a structure so that the luminous fluxes 5a1 and 5b1 are emitted from the same light source and pass through the same optical path up to the half mirror 76.

The luminous flux 5b1 for detecting air fluctuation is reflected by the half mirror 76 and thereafter, passes through substantially the same space as the luminous flux 5a1 and it is made to directly enter the light receiving means 6 as the luminous flux 6b1. Then, the information on the height of the wafer 4 is detected in accordance with the difference between the positions of centers of gravity of the luminous fluxes 6a1 and 6b1 emitted from the light receiving means 6, similar to the case of the embodiment 1.

Figure 10:
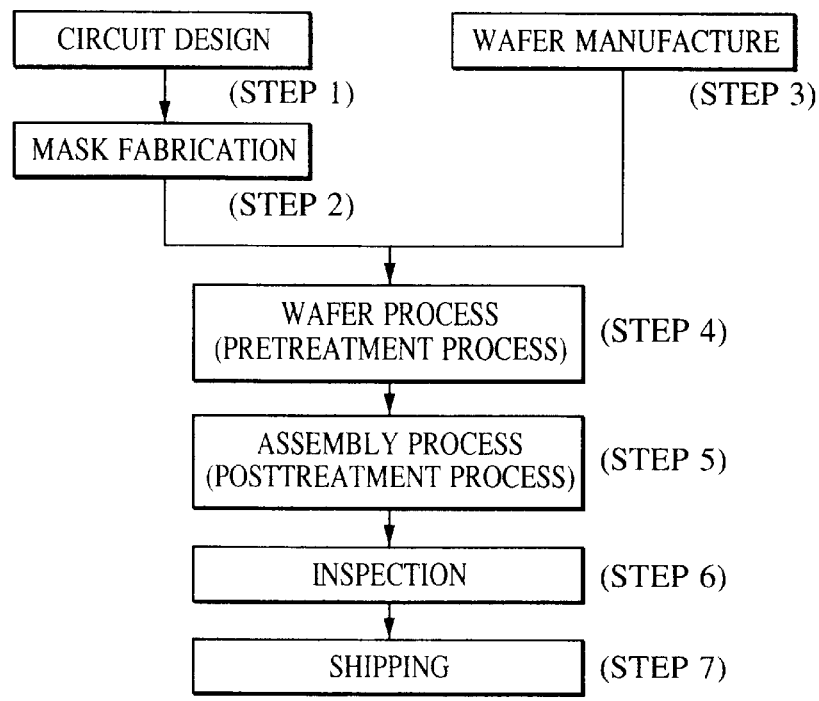
FIG. 10 is a flow chart of a device fabrication method.

An embodiment of a device fabrication method using the above-described aligner is described below. FIG. 10 shows the flow of steps of the fabrication of a semiconductor device (e.g. a semiconductor chip of IC or LSI, a liquid crystal panel, or a CCD).

In step 1 (circuit design), circuits of a semiconductor device are designed. In step 2 (mask fabrication), a mask with a designed circuit pattern formed on it is fabricated. In step 3 (wafer manufacture), a wafer is manufactured by using a material such as silicon. Step 4 (wafer process) is referred to as a pretreatment process in which an actual circuit is formed on the prepared wafer by using the prepared mask by means of lithography using the projection aligner of any one of the above embodiments.

The next step 5 (assembly) is referred to as a posttreatment process which is a process for forming a semiconductor chip by using the wafer manufactured in step 4 and includes an assembly process (dicing and bonding) and a packaging process (chip sealing). In step 6 (inspection), an operation confirmation test and a durability test of the semiconductor device fabricated in step 5 are performed. The semiconductor device is completed after passing through the above processes and then shipped (step 7).

Figure 11:
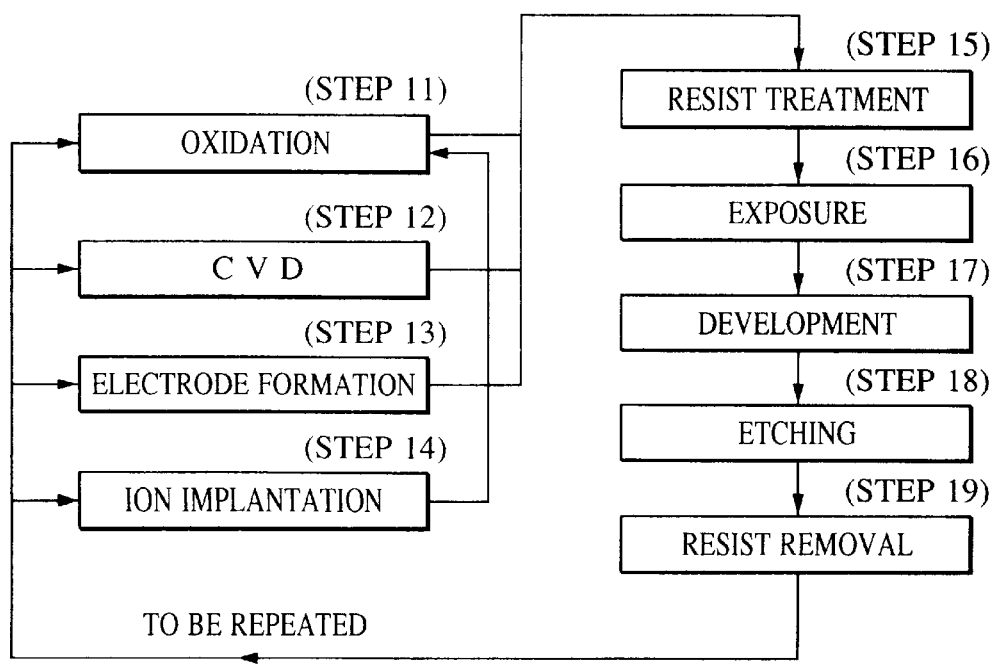
FIG. 11 is a flow chart of a device fabrication method.

FIG. 11 shows a detailed flow chart of the above wafer process of step 4. In step 11 (oxidation), the surface of a wafer is oxidized. In step 12 (CVD, chemical vapor deposition), an insulating film is formed on the wafer surface. In step 13 (electrode formation), electrodes are formed on the wafer by vacuum evaporation. In step 14 (ion implantation), ions are implanted into the wafer. In step 15 (resist treatment), a photosensitive material is applied to the wafer. In step 16 (exposure), a circuit pattern on the mask is printed onto the wafer and exposed by the projection aligner of any one of the above embodiments.

In step 17 (development), the exposed wafer is developed. In step 18 (etching), portions other than a developed resist image are removed. In step 19 (resist removal), unnecessary resist after etching is removed. By repeating these steps, multiple circuit patterns are formed on a wafer.

By using the fabrication method of this embodiment using the above-described position sensor, it is possible to fabricate a semiconductor device with a high degree of integration which cannot conventionally be fabricated.

What is claimed is:

1. A position detecting apparatus for detecting the position of a substrate in the interval direction in which the substrate is spaced by an interval from a pattern-printing projection optical system for printing a pattern on the substrate, said apparatus comprising:

a first luminous flux projecting system for projecting a first luminous flux to the substrate from a direction oblique to the interval direction;

a first luminous flux receiving system for receiving the first luminous flux after the first luminous flux is reflected from the substrate;

a second luminous flux projecting system for projecting a second luminous flux to a reflection member arranged at the side portion of the bottom end of said pattern-printing projection optical system;

a second luminous flux receiving system for receiving the second luminous flux after the second luminous flux is reflected by the reflection member; and means for detecting the position of the substrate in the interval direction by detecting the position at which said first luminous flux receiving system receives the first luminous flux and by detecting the position at which said second luminous flux receiving system receives the second luminous flux.

2. An apparatus according to claim 1, wherein said second luminous flux projecting system projects the second luminous flux to the reflection member via a different optical path than said first luminous flux projecting system projects the first luminous flux to the substrate.

3. An apparatus according to claim 1, wherein a portion of the optical paths of the first and second luminous fluxes are the same before the first luminous flux reaches the neighborhood of the substrate, and then the optical paths are separated from each other.

4. An apparatus according to claim 3, wherein said second luminous flux projecting system has an optical member arranged between said second luminous flux projecting system and the substrate to separate the first luminous flux from the second luminous flux.

5. An apparatus according to claim 4, wherein said second luminous flux receiving system is arranged so as to directly receive the second luminous flux separated by the optical member.

6. A position detecting apparatus for detecting the position of a substrate in the interval direction in which the substrate is spaced by an interval from a pattern-printing projection optical system for printing a pattern on the substrate, said apparatus comprising:

a first luminous flux projecting system for projecting a first group of luminous fluxes to the substrate from a direction oblique to the interval direction;

a first luminous flux receiving system for receiving the first group of luminous fluxes reflected from the substrate;

a second luminous flux projecting system for projecting a second group of luminous fluxes to a reflection member arranged at the side portion of the bottom end of the pattern-printing projection optical system;

a second luminous flux receiving system for receiving the second group of luminous fluxes reflected by the reflection member; and means for detecting the position of the substrate in the interval direction by detecting the position at which said first luminous flux receiving system receives at least any one of the first group of luminous fluxes and by detecting the position at which said second luminous flux receiving system receives at least any one of the second group of luminous fluxes.

7. An apparatus according to claim 6, wherein the first group of luminous fluxes includes at least two luminous fluxes and the positions at which the two luminous fluxes are incident on the substrate are arranged so as to sandwich an area for printing a pattern on the substrate by the pattern-printing projection optical system.

8. An apparatus according to claim 6, further comprising means for detecting the tilt of an area of the substrate on which the pattern is to be printed by detecting at least two positions for receiving a first group of luminous fluxes by said first luminous flux receiving system and at least two positions for receiving a second group of luminous fluxes by said second luminous flux receiving system.

9. A device fabrication method comprising the steps of:
arranging a pattern-printing projection optical system at a position to print a device pattern on a substrate at a printing position on the substrate;
projecting a first luminous flux to the substrate from a direction oblique with respect to an interval direction in which the substrate and the pattern-printing projection optical system are spaced apart by an interval;
reflecting the first luminous flux from the substrate;
receiving the first luminous flux reflected from the substrate;
projecting a second luminous flux to a reflection member arranged at the side portion of the bottom end of the pattern-printing projection optical system;
reflecting the second luminous flux from the reflection member;
receiving the second luminous flux reflected from the reflection member;
adjusting the interval between the substrate and the pattern-printing projection optical system by detecting the positions at which the first luminous flux and the second luminous flux are received in said receiving steps;
printing a device pattern on the substrate with the pattern-printing projection optical system; and
repeating said projecting, receiving, adjusting, and printing steps a plurality of times to form the device on the substrate.

10. A positional detecting apparatus for detecting the position of a substrate in the interval direction in which the substrate is spaced by an interval from a pattern-printing projection optical system for printing a pattern on the substrate, said apparatus comprising:
a first luminous flux projection system for projecting a first luminous flux to the substrate from a direction oblique to the interval direction;
a first luminous flux receiving system for receiving the first luminous flux after the first luminous flux is reflected from the substrate;
a second luminous flux projecting system for projecting a second luminous flux to a reflection member arranged so that exposure light going through the pattern-printing projection optical system is not projected on the reflection member;
a second luminous flux receiving system for receiving the second luminous flux after the second luminous flux is reflected by the reflection member; and
means for detecting the position of the substrate in the interval direction by detecting the position at which said first luminous flux receiving system receives the first luminous flux and by detecting the position at which said second luminous flux receiving system receives the second luminous flux.

11. A positional detecting apparatus for detecting the position of a substrate in the interval direction in which the substrate is spaced by an interval from a pattern-printing projection optical system for printing a pattern on the substrate, said apparatus comprising:
a first luminous flux projection system for projecting a first luminous flux to the substrate from a direction oblique to the interval direction;
a first luminous flux receiving system for receiving the first luminous flux after the first luminous flux is reflected from the substrate;
a second luminous flux projecting system for projecting a second luminous flux;
a second luminous flux receiving system for receiving the second luminous flux reflected only by one or more reflection elements external to the pattern-printing projection optical system and the substrate; and
means for detecting the position of the substrate in the interval direction by detecting the position at which said first luminous flux receiving system receives the first luminous flux and by detecting the position at which said second luminous flux receiving system receives the second luminous flux.

12. An apparatus according to claim 11, wherein said first and second luminous flux projection systems comprise a common light source means.

13. A device fabrication method comprising the step of:
arranging a pattern-printing projection optical system at a position to print a device pattern on a substrate at a printing position on the substrate;
projecting a first luminous flux to the substrate from a direction oblique to the interval direction;
reflecting the first luminous flux from the substrate;
receiving the first luminous flux reflected from the substrate;
projecting a second luminous flux;
receiving the second luminous flux reflected only by one or more reflection elements external to the pattern-printing projection optical system and the substrate;
adjusting the interval between the substrate and the pattern-printing projection optical system by detecting the positions at which the first luminous flux and the second luminous flux are received in said receiving steps;
printing a device pattern on the substrate with the pattern-printing projection optical system; and
repeating said projecting, receiving, adjusting, and printing steps a plurality of times to form the device on the substrate.

14. A position detecting apparatus for detecting the position of a substrate in the interval direction in which the substrate is spaced by an interval from a pattern-printing projection optical system for printing a pattern on the substrate, said apparatus comprising:
a first luminous flux projecting system projecting a first luminous flux to the substrate from a direction oblique to the interval direction;
a first luminous flux receiving system receiving the first luminous flux after the first luminous flux is reflected from the substrate;
a second luminous flux projecting system projecting a second luminous flux so that the second luminous flux transmits over the substrate substantially parallel to the surface of the substrate;
a second luminous flux receiving system receiving the second luminous flux from said second luminous flux projecting system; and
means for detecting the position of the substrate in the interval direction by detecting the position at which said first luminous flux receiving system receives the first luminous flux and by detecting the position at which said second luminous flux receiving system receives the second luminous flux.

15. An apparatus according to claim 14, wherein said first and second luminous flux projection systems comprise a common light source means.

16. A device fabrication method comprising the step of:

arranging a pattern-printing projection optical device system at a position to print a device pattern on a substrate at a printing position on the substrate;

projecting a first luminous flux to the substrate from a direction oblique to the interval direction;

reflecting the first luminous flux from the substrate;

receiving the first luminous flux reflected from the substrate;

projecting a second luminous flux so that the second luminous flux transmits over the substrate substantially parallel to the surface of the substrate;

receiving the projected second luminous flux; and adjusting the interval between the substrate and the pattern-printing projection optical system by detecting the positions at which the first luminous flux and the second luminous flux are received in said receiving steps;

printing a device pattern on the substrate with the pattern-printing projection optical system; and repeating said projecting, receiving, adjusting, and printing steps a plurality of times to form the device on the substrate.

* * * * *

UNITED STATES PATENT AND TRADEMARK OFFICE
CERTIFICATE OF CORRECTION

PATENT NO. : 6,124,601

DATED : September 26, 2000

INVENTOR(S) : MINORU YOSHII, ET AL.

It is certified that error appears in the above-identified patent and that said Letters Patent is hereby corrected as shown below:

COLUMN 1
Line 53, "performing" should read --performed--.

COLUMN 5
Line 23, "the both" should read --both the--.

COLUMN 7
Line 41, "$\Delta_n$" should read --$\Delta_o$--.
Line 47, "$\Delta_e$" should read --$\Delta_o$--.

Signed and Sealed this

Twenty-fourth Day of April, 2001

*Attest:*

NICHOLAS P. GODICI

*Attesting Officer*  Acting Director of the United States Patent and Trademark Office